United States Patent
Sasaki

(10) Patent No.: US 10,347,670 B2
(45) Date of Patent: Jul. 9, 2019

(54) PHOTODETECTION ELEMENT

(71) Applicant: KABUSHIKI KAISHA TOSHIBA, Tokyo (JP)

(72) Inventor: Keita Sasaki, Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/699,888

(22) Filed: Sep. 8, 2017

(65) Prior Publication Data

US 2018/0269236 A1    Sep. 20, 2018

(30) Foreign Application Priority Data

Mar. 15, 2017   (JP) ................... 2017-050274

(51) Int. Cl.
*H01L 31/18*      (2006.01)
*H01L 27/144*     (2006.01)
*H01L 31/107*     (2006.01)
*H01L 31/0216*    (2014.01)

(52) U.S. Cl.
CPC .... *H01L 27/1446* (2013.01); *H01L 31/02161* (2013.01); *H01L 31/107* (2013.01); *H01L 31/1804* (2013.01)

(58) Field of Classification Search
CPC ............. H01L 27/1446; H01L 31/1804; H01L 31/02161; H01L 31/107
See application file for complete search history.

(56) References Cited

U.S. PATENT DOCUMENTS

| 6,225,670 B1 * | 5/2001 | Dierickx ........... H01L 27/14643 257/431 |
| 6,252,286 B1 * | 6/2001 | Arai ........................ G11B 7/13 257/184 |
| 6,838,714 B2 * | 1/2005 | Rhodes ............. H01L 27/14609 257/233 |
| 7,728,366 B2 * | 6/2010 | Oohashi ................ H01L 31/108 257/292 |
| 8,368,159 B2 | 2/2013 | Dautet et al. |
| 8,629,485 B2 | 1/2014 | Yamamura et al. |
| 8,994,138 B2 * | 3/2015 | Roy ............................. 257/443 |
| 2005/0129079 A1 * | 6/2005 | Iwai ....................... H01L 31/153 372/50.1 |
| 2013/0187251 A1 | 7/2013 | Yamamura et al. |

(Continued)

FOREIGN PATENT DOCUMENTS

JP    2008-153311    7/2008
JP    2011-003739    1/2011

(Continued)

*Primary Examiner* — Victor A Mandala
(74) *Attorney, Agent, or Firm* — Oblon, McClelland, Maier & Neustadt, L.L.P.

(57) ABSTRACT

A photodetection element according to an embodiment includes: a photodiode cell, the photodiode cell including: a semiconductor substrate; a first semiconductor layer disposed on the semiconductor substrate; a second semiconductor layer disposed in a region including an interface between the semiconductor substrate and the first semiconductor layer, the second semiconductor layer being of the same conductivity type as the semiconductor substrate; and a third semiconductor layer disposed in a surface region of the first semiconductor layer.

9 Claims, 10 Drawing Sheets

(56) References Cited

U.S. PATENT DOCUMENTS

2016/0218236 A1* 7/2016 Dhulla ................ H01L 31/107
2017/0315218 A1* 11/2017 Yonehara .............. G01S 7/4816

FOREIGN PATENT DOCUMENTS

| JP | 2013-065911 | 4/2013 |
| JP | 2014-225714 | 12/2014 |
| JP | 2015-084392 | 4/2015 |
| JP | 5837689 | 11/2015 |

* cited by examiner

PHOTODETECTION ELEMENT

CROSS REFERENCE TO RELATED APPLICATIONS

This application is based upon and claims the benefit of priority from the prior Japanese Patent Application No. 2017-050274, filed on Mar. 15, 2017, the entire contents of which are incorporated herein by reference.

FIELD

Embodiments described herein relate generally to photodetection elements.

BACKGROUND

A silicon photomultiplier (hereinafter also referred to as SiPM) is a photodetection element in which avalanche photodiode cells (hereinafter referred to as APD cells) are two-dimensionally arranged in parallel. As the APD cells are activated at a higher reverse bias voltage than the breakdown voltage of the APD cells, the SiPM is driven in a region called Geiger mode. The gain of each APD cell in a Geiger-mode operation is $10^5$ to $10^6$, which is extremely high, and thus, very weak light from a single photon can be measured.

A high resistor called a quench resistor is connected in series to each APD cell. When a photon enters and causes Geiger discharge, the amplification effect ends due to a voltage drop caused by the quench resistor. As a result, a pulse output signal is obtained. In a SiPM, each APD cell functions in this manner. Therefore, when Geiger discharge is caused in more than one APD cell, an output signal with a charge amount or a pulse height value several times greater than that of the APD cells that have caused the Geiger discharge is obtained as an output signal from one APD cell. Accordingly, the number of the APD cells that have caused the Geiger discharge, or the number of photons that have entered the SiPM, can be measured from an output signal. Thus, photon measurement can be conducted for each one photon.

The device characteristics of an SiPM include photon detection efficiency, which serves as a sensitivity indicator, gain, the dark count rate of noise components due to a thermal factor, crosstalk of noise components due to light emission occurring in an avalanche process, and afterpulse of noise components due to carrier capture and re-emission. All of these characteristics depend on overvoltage (defined as "drive voltage-breakdown voltage").

As described above, the device characteristics of an SiPM have high dependence on overvoltage, and greatly vary with drive conditions. For example, an SiPM can be driven at a low overvoltage in a system expected to be operated in low-noise environments, and can be driven at a high overvoltage in a system with its priority put on sensitivity. The critical aspect here is the uniformity in breakdown voltage among the APD cells constituting the SiPM. An output signal of the SiPM is formed by superimposing output signals of the respective APD cells connected in parallel. Therefore, output signals are handled on the assumption that the APD cells have uniform characteristics in principle. However, if the breakdown voltages vary, the characteristics of the APD cells vary, and the charge amounts of output signals from the APD cells also vary. As a result, the photon measurement accuracy becomes lower. Therefore, to conduct high-accuracy photon measurement, it is necessary to provide an SiPM without variation in breakdown voltage.

An SiPM having a vertical structure is known. In this SiPM, a PN junction is formed at an interface between a semiconductor region (P-type) formed through epitaxial growth and a semiconductor region (N-type) of a substrate, and a depletion layer spreads on the light receiving surface side as a reverse bias voltage is applied. When the depletion layer reaches the edge of the high-doped semiconductor region of the light receiving surface, and continues to sweep the reverse bias voltage, avalanche breakdown occurs. That is, the breakdown voltage is determined by the thickness of the epitaxial layer or the depth of the semiconductor region of the light receiving surface formed by ion implantation. The acceptable range of variation in the thickness of the epitaxial layer in a wafer plane due to epitaxial growth is normally approximately ±2% of the thickness. Therefore, if the thickness of the epitaxial layer is designed to be 3 µm, the variation is approximately 120 nm.

Meanwhile, the breakdown voltage of an SiPM is attributed to the APD cell structure, but varies in a range of 20 mV/nm with thickness variation. Therefore, where the thickness variation is 120 nm, the variation in breakdown voltage is approximately 2.4 V at a maximum, and the device characteristics of the APD cells in a Geiger mode will vary greatly. However, controlling the thickness of the epitaxial layer to several nanometers so as to reduce the variation in breakdown voltage might lead to increases in technical difficulties and costs.

DETAILED DESCRIPTION

A photodetection element according to an embodiment includes: a photodiode cell, the photodiode cell including: a semiconductor substrate; a first semiconductor layer disposed on the semiconductor substrate; a second semiconductor layer disposed in a region including an interface between the semiconductor substrate and the first semiconductor layer, the second semiconductor layer being of the same conductivity type as the semiconductor substrate; and a third semiconductor layer disposed in a surface region of the first semiconductor layer.

The following is a description of embodiments of the present invention, with reference to the accompanying drawings.

Embodiment

Figure 1A:
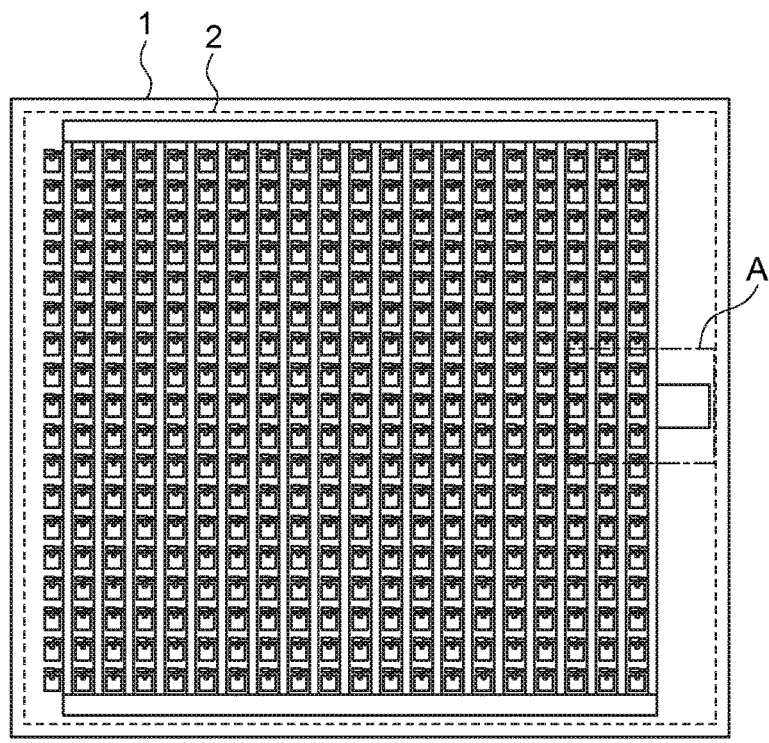
FIG. 1A is a plan view of a photodetection element according to an embodiment.
Figure 1B:
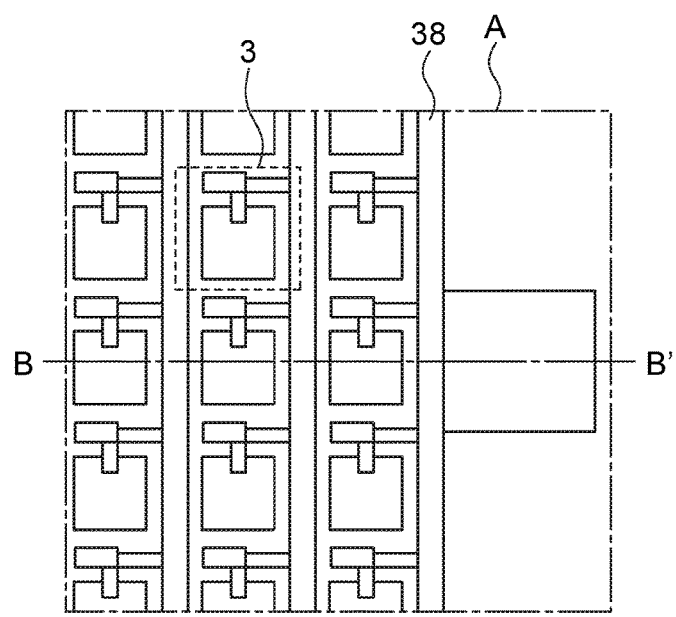
FIG. 1B is a partially enlarged view of the photodetection element shown in FIG. 1A.

FIGS. 1A and 1B show a photodetection element according to an embodiment. The photodetection element of this embodiment is a SiPM. FIG. 1A is a plan view of the photodetection element, seen from the light incident surface side. FIG. 1B is an enlarged view of the region surrounded by a dot-and-dash line A shown in FIG. 1A.

This photodetection element 1 includes APD cells 3 arranged in a matrix form. The APD cells 3 are connected in parallel by signal readout lines 38, and thus, constitute an SiPM 2.

Figure 2:
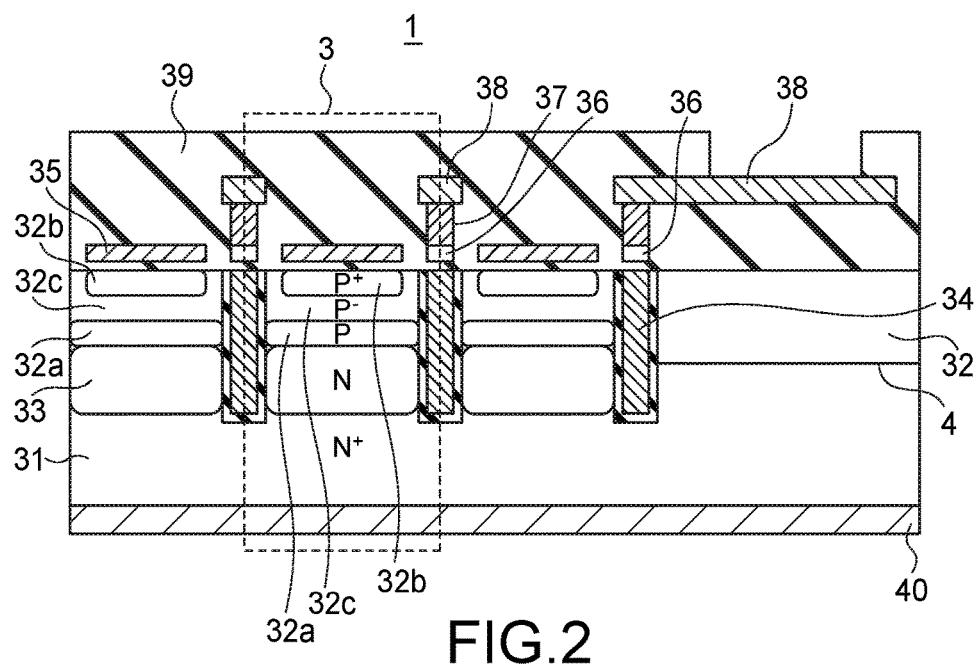
FIG. 2 is a cross-sectional view of the photodetection element according to the embodiment.

FIG. 2 is a cross-sectional view of the photodetection element 1 of this embodiment, taken along the section line B-B' shown in FIG. 1B. The photodetection element 1 includes the APD cells 3. Each APD cell 3 includes an N-type semiconductor layer 33 disposed in a region in which a P$^-$-type epitaxial layer 32 is disposed on an N$^+$-type semiconductor substrate 31, and an interface 4 between the P$^-$-type epitaxial layer 32 and an N$^+$-type semiconductor substrate 31 is included. That is, the semiconductor layer 33 is joined to the semiconductor substrate 31. The doping concentration in the semiconductor layer 33 is lower than the doping concentration in the semiconductor substrate 31.

A P-type semiconductor layer 32a is disposed on the N-type semiconductor layer 33. The doping concentration in the P-type semiconductor layer 32a is higher than the doping concentration in the epitaxial layer 32. The N-type semiconductor layer 33 and the P-type semiconductor layer 32a form a diode structure. A P$^+$-type semiconductor layer 32b is further disposed in a near-surface region of the P$^-$-type epitaxial layer 32. The doping concentration in the P$^+$-type semiconductor layer 32b is higher than the doping concentration in the semiconductor layer 32a. The region of the epitaxial layer 32 located between the lower portion of the P$^+$-type semiconductor layer 32b and the upper portion of the N-type semiconductor layer 33 serves as an avalanche layer 32c. The semiconductor layer 33, the P-type semiconductor layer 32a, and the P$^+$-type semiconductor layer 32b are formed by ion implantation, for example.

The APD cells 3 are electrically separated from one another by a trench isolation structure 34 disposed in the semiconductor substrate 31 and the epitaxial layer 32. In each APD cell 3, a quench resistor 36 is further disposed on the trench isolation structure 34. One terminal of the quench resistor 36 is connected to the anode of the photodiode of the corresponding APD cell 3, and the other terminal is connected to a contact 37 disposed on the quench resistor 36. The contact 37 is connected to signal readout lines 38. The contact 37 is used in extracting the electric charge generated in the avalanche layer 32c. The signal readout lines 38 are connected to a grounded power source.

In each APD cell 3, an antireflection layer 35 is further disposed on the light incident surface of the avalanche layer 32c, to reduce reflection from the silicon interface. That is, the antireflection layer 35 is disposed on the P$^+$-type semiconductor layer 32b of each corresponding APD cell 3. The antireflection layer 35, the quench resistor 36, the contact 37, and the signal readout lines 38 are disposed in a dielectric layer 39. On the back surface side of the semiconductor substrate 31, a back-surface electrode 40 is further disposed as the cathode electrode of each APD cell 3. As a result, the APD cells 3 are connected in parallel between the back-surface electrode 40 and the grounded power source.

It should be noted that FIGS. 1A through 2 show an example for briefly explaining an SiPM, and the semiconductor layer 33 of the same conductivity type as the semiconductor substrate 31 is disposed at the interface 4 between the semiconductor substrate 31 and the epitaxial layer 32, and is joined to the semiconductor substrate 31.

Figure 3:
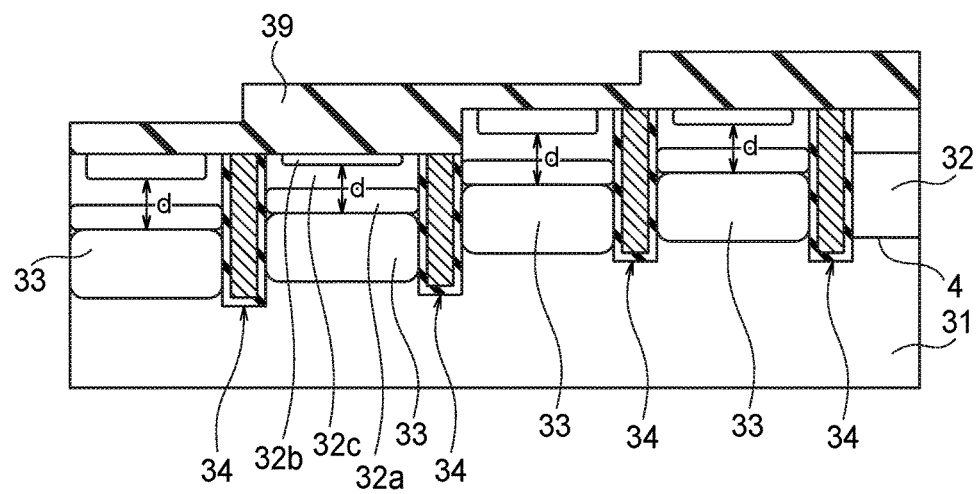
FIG. 3 is a diagram for explaining the effects of the photodetection element according to the embodiment.

To briefly explain the effects of this embodiment, FIG. 3 shows a cross-sectional view of the SiPM according to this embodiment including the semiconductor substrate 31 with which the thickness of the epitaxial layer 32 or the dielectric layer 39 at the time of ion implantation varies.

For example, in the case of the structure disclosed in JP-A 2015-84392 (KOKAI), the thickness d of the depletion layer, which determines the breakdown voltage, is the distance from the bottom of the P$^+$-type semiconductor layer 32b on the light incident surface side of the epitaxial layer 32 to the PN junction at the interface 4 between the semiconductor substrate 31 and the epitaxial layer 32, because the semiconductor layer 33 is not included in the structure. Where the thickness of the epitaxial layer 32 varies, the thickness d of the depletion layer of course also varies by the variation in the thickness.

Where ion implantation is performed in such a surface state that the thickness of the dielectric layer 39 varies, the depth of permeation of the doner or accepter in accordance with the variation in the thickness of course varies. Therefore, since the depth of the bottom of the P$^+$-type semiconductor layer 32b varies as shown in FIG. 3, the thickness d of the depletion layer varies. Since the breakdown voltage is proportional to the thickness d of the depletion layer, the breakdown voltage varies with substrate conditions in the structure disclosed in JP-A 2015-84392 (KOKAI).

In the structure according to this embodiment, on the other hand, the thickness d of the depletion layer is determined by the bottom of the P$^+$-type semiconductor layer 32b and the top of the semiconductor layer 33, as shown in FIG. 3. Accordingly, the thickness d of the depletion layer is maintained at a constant value, though the positions vary. Thus, variation in the breakdown voltage can be reduced or prevented, without being affected by substrate conditions.

Figure 4A:
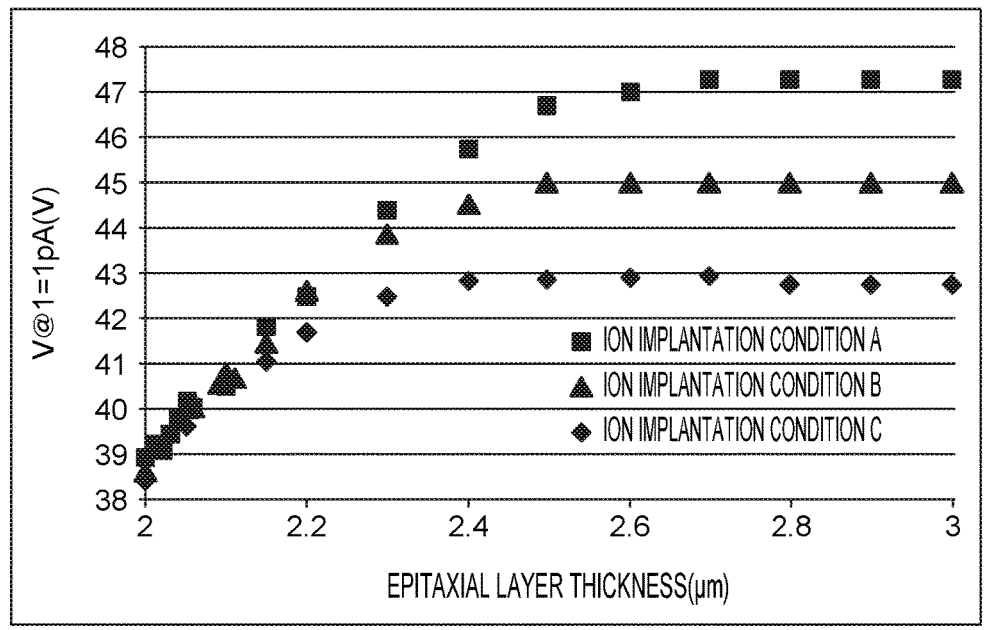
FIGS. 4A and 4B are diagrams for explaining the effects of the photodetection element according to the embodiment.
Figure 4B:
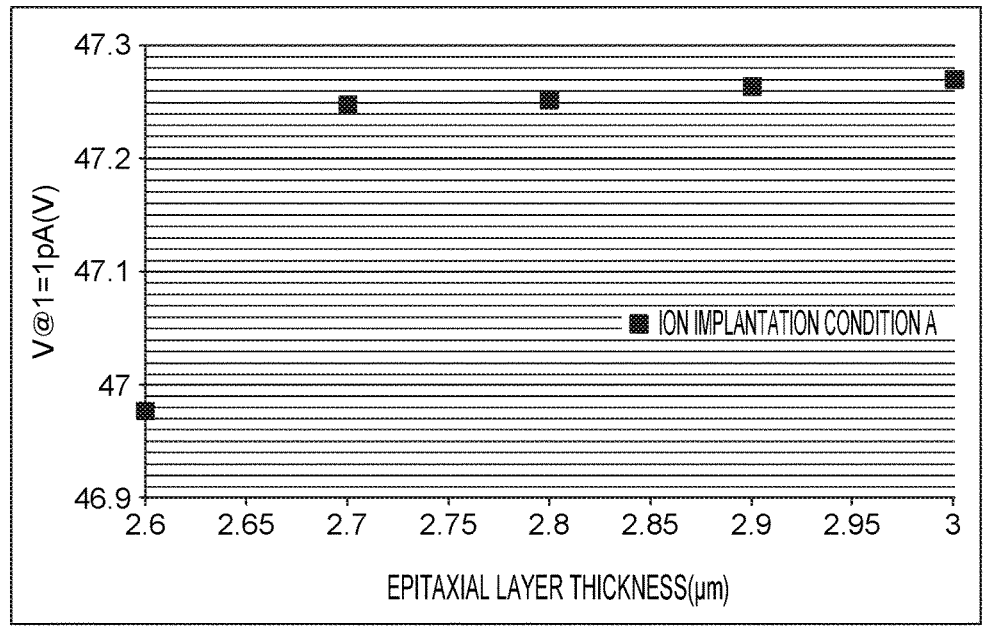

This effect is now described, with reference to FIGS. 4A and 4B. FIG. 4A is a graph formed by plotting the voltage values at an output current 1 pA in APD cells 3 formed under three different ion implantation conditions A, B, and C with respect to the substrate condition in which the thickness of the epitaxial layer 32 varies.

In the photodetection element of this embodiment, the epitaxial layer 32 is designed to have an appropriate thickness range in accordance with the ion implantation condition, so that variation in the voltage value of the specified current is reduced in a wide region, as described above. FIG. 4B shows an enlarged graph of the region where the voltage value does not vary. The variation in the voltage value is reduced to a smaller value than 20 mV in the region where the epitaxial layer is 2.7 μm to 3.0 μm. As this value is 1/300 of the variation in the voltage value in the structure disclosed in JP-A 2015-84392 (KOKAI), the effect is obvious.

(Manufacturing Method)

Referring now to FIGS. 5 through 11, a method of manufacturing the SiPM of this embodiment is described.

First, the P$^-$-type epitaxial layer 32 is formed on the N-type semiconductor substrate 31 through epitaxial growth. The semiconductor substrate 31 is formed by doping a silicon substrate with a donor ion such as Sb, As, or P, and the peak concentration is an doping concentration of $1.0 \times 10^{18}$ atoms/cm$^3$ to $5.0 \times 10^{19}$ atoms/cm$^3$. The epitaxial layer 32 is doped with an acceptor ion such as B, and the peak concentration is an doping concentration of $1.0 \times 10^{13}$ atoms/cm$^3$ to $1.0 \times 10^{16}$ atoms/cm$^3$. The thickness of the epitaxial layer is normally in the range of 1 μm to 5 μm, but may be 5 μm or greater.

Figure 5:
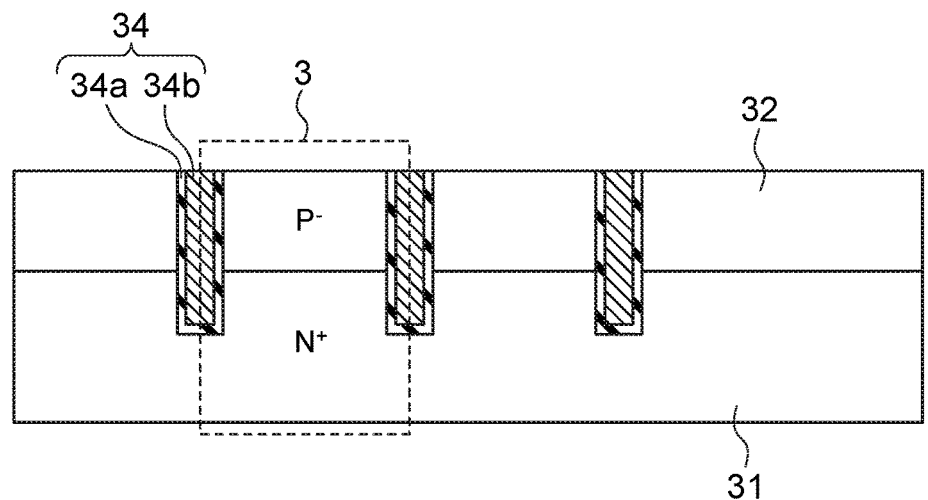
FIGS. 5 to 11 are cross-sectional views showing a procedure for manufacturing the photodetection element according to the embodiment.

The trench isolation structure 34 is then formed, to prevent electrical interference of adjacent APD cells 3 (FIG. 5). The trench isolation structure 34 is formed by creating a trench in the epitaxial layer 32 and the semiconductor substrate 31, and burying an dielectric layer in the trench. Alternatively, a dielectric layer 34a may be formed on the bottom surface and the side surface of each trench, and a metal layer 34b is then formed, as shown in FIG. 5. The trench isolation structure 34 may be formed in this manner. The metal layer 34b performs optical blocking, and thus, prevent optical crosstalk between the adjacent APD cells 3.

Examples of materials used as the metal layer 34b of the trench isolation structure 34 include at least one selected from the group consisting of W, Ti, Co, Cr, Mg, and Cu. Although the depth of the trench isolation structure 34 reaches the N-type semiconductor substrate 31 in FIG. 5, the trench isolation structure 34 may be made to stay within the P-type epitaxial layer 32, with electrical and optical influence on the adjacent APD cells 3 being taken into consideration. Although not shown in FIG. 5, a donor may be implanted into the regions surrounding the trench isolation structure 34, to restore the crystal defects caused by the formation of the trench isolation structure 34.

Figure 6:
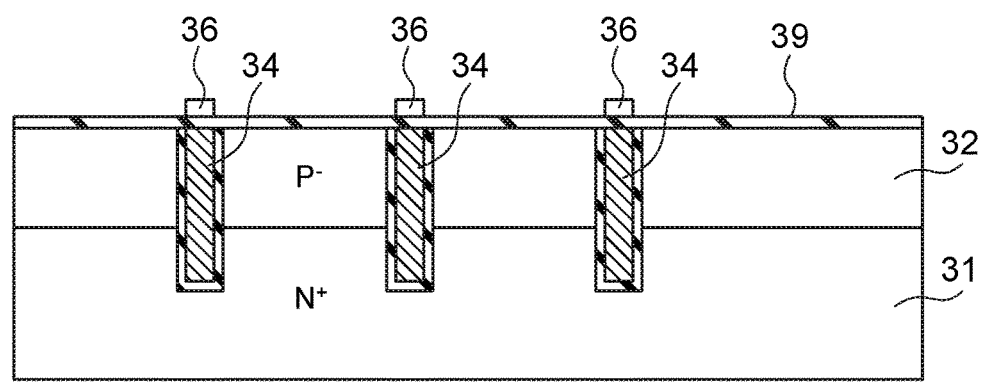

The dielectric layer 39 is then formed on the surface of the P-type epitaxial layer 32. The dielectric layer 39 is formed with a material transparent to light in a wavelength band to which the SiPM is sensitive, such as silicon oxide. Polysilicon is then deposited on the dielectric layer 39, and patterning is performed on the polysilicon by a lithography technique, so that the quench resistor 36 is formed on the trench isolation structure 34 (FIG. 6). The quench resistor 36 is preferably disposed on the trench isolation structure 34, but may be disposed on the APD cells 3 so as not to cover the light receiving region or so as to cover only part of the light receiving region if it is difficult to form the quench resistor 36 on the trench isolation structure 34. The quench resistor 36 has a resistance value of several hundreds of kΩ to several thousands of kΩ, though varying with specifications such as the size and the response characteristics of the APD cells 3.

Figure 7:
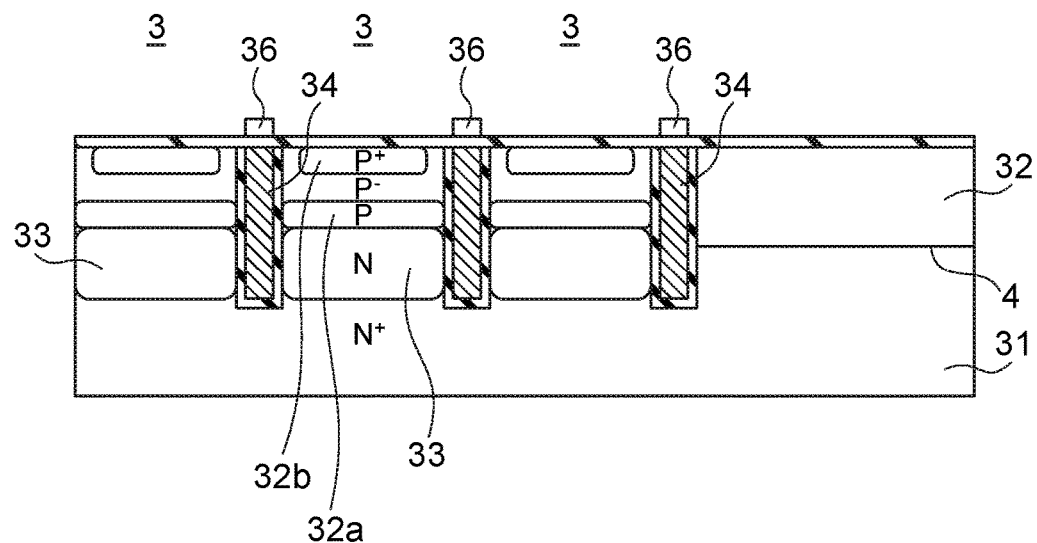

After that, an ion implantation process and a thermal diffusion process are carried out, to form the APD cells 3 that serve as a high-field region by reverse bias driving and cause avalanche amplification (FIG. 7). Specifically, a donor such as P or As is implanted into a deep region in the interface 4 between the semiconductor substrate 31 and the epitaxial layer 32, so that the N-type semiconductor layer 33 is formed. An acceptor such as B or BF$_2$ is further implanted, so that the P-type semiconductor layer 32a is formed in a shallower region than the peak depth in the semiconductor layer 33, and the P$^+$-type semiconductor layer 32b to function as the anode electrode is formed on the light incident surface side of the epitaxial layer 32.

At this point, to cancel the influence of variation in the thickness of the dielectric layer 39 on the light incident surface side of the epitaxial layer 32, the ion implantation process is carried out in a continuous process. As for the process conditions in the ion implantation process for forming the semiconductor layer 33, the dose amount is in the range of $1.0 \times 10^{12}$ atoms/cm$^3$ to $1.0 \times 10^{14}$ atoms/cm$^3$, and the acceleration energy is in the range of 1.0 MeV to 5.0 MeV, though depending on the depth of the interface 4. The dose amount and the acceleration energy are determined so that the semiconductor layer 33 is joined to the interface 4 and the semiconductor substrate 31 after the thermal diffusion process, with the thickness and variation of the epitaxial layer 32 and the thickness and variation of the dielectric layer 39 at the time of ion implantation process. The region of the epitaxial layer 32 located between the lower portion of the P*-type semiconductor layer 32b and the upper portion of the N-type semiconductor layer 33 serves as an avalanche layer 32c. The ion implantation condition shown in FIGS. 4A and 4B fall within the above conditions.

Figure 8:
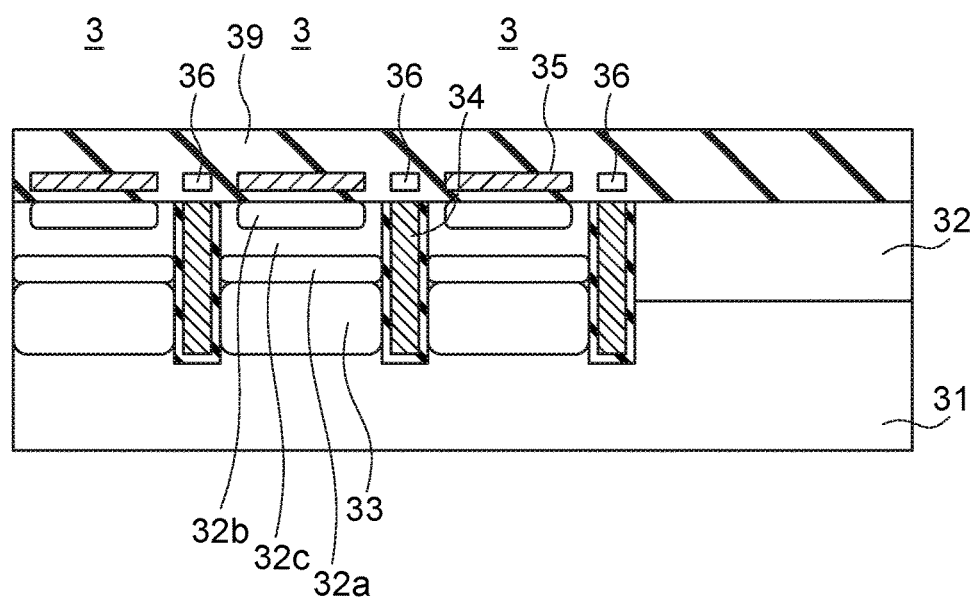

An antireflection material is then deposited on the dielectric layer 39, and patterning is performed by a lithography technique, so that the antireflection layer 35 is formed on the APD cells 3. The antireflection layer 35 is formed to increase the sensitivity of the APD cells 3. In accordance with the specifications such as the wavelength bands to which the SiPM is sensitive, a silicon nitride of 10 nm to 100 nm in thickness is formed as the antireflection layer 35, so that the antireflection layer 35 has a structure utilizing an interference effect. After the antireflection layer 35 is formed, an dielectric layer is deposited (FIG. 8). The same material as the dielectric layer 39 is used for this dielectric layer, and which are shown as the same layer in FIG. 8.

Figure 9:
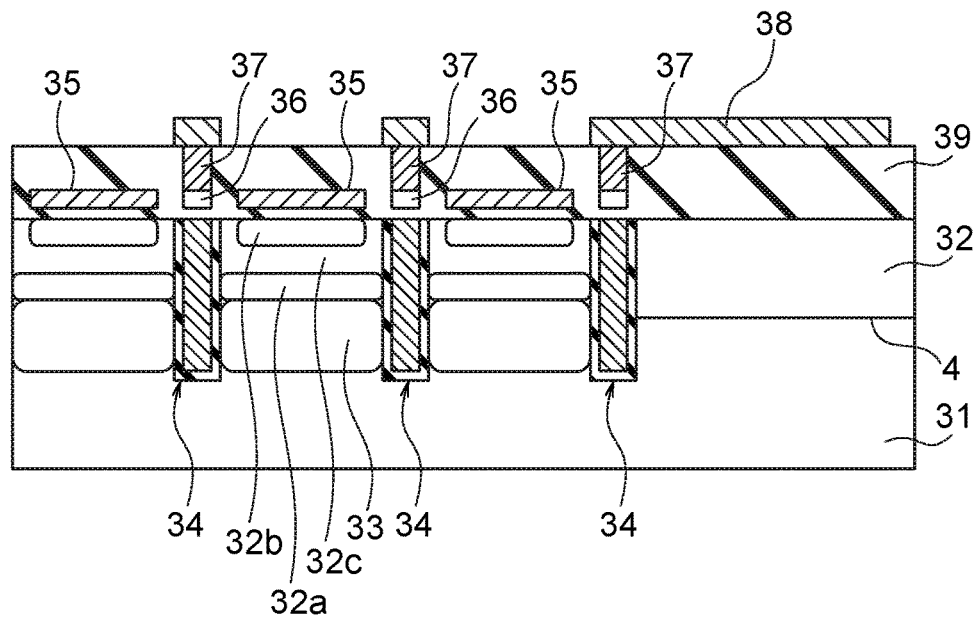

To extract the avalanche-amplified charge as an output signal from the APD cells 3, a trench that reaches the quench resistor 36 is formed in the dielectric layer 39, and a conductive material such as a metal is buried in the trench, to form the contact 37. A sputtering a metal material is then formed on the dielectric layer 39, and patterning is performed, so that the signal readout lines 38 are formed (FIG. 9). Although partially not shown in FIG. 7, an output charge from the APD cell 3 is transported to the signal readout lines 38 via the quench resistor 36 in this structure.

Figure 10:
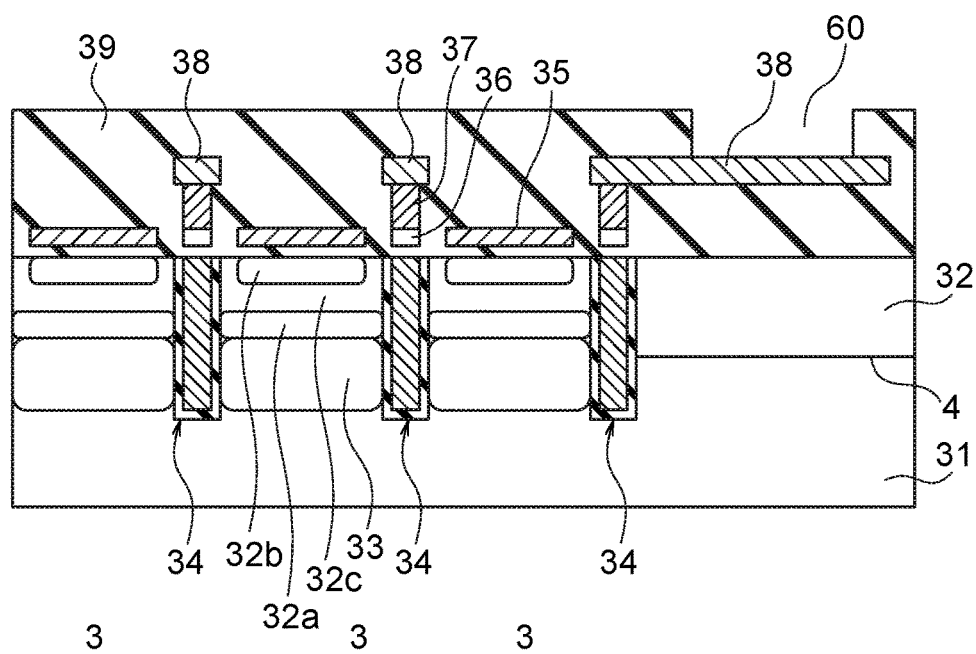

A dielectric layer of the same material as the dielectric layer shown in FIG. 9 is then deposited, and passivation is performed. A pad opening 60 for outputting an output signal from the SiPM to a readout circuit through wire bonding or the like is then formed in the dielectric layer 39 (FIG. 10). The bottom surface of the pad opening 60 is located on the signal readout lines 38. The signal readout lines 38 exposed through the pad opening 60, and is connected to the readout circuit (not shown) by a bonding wire or the like.

Figure 11:
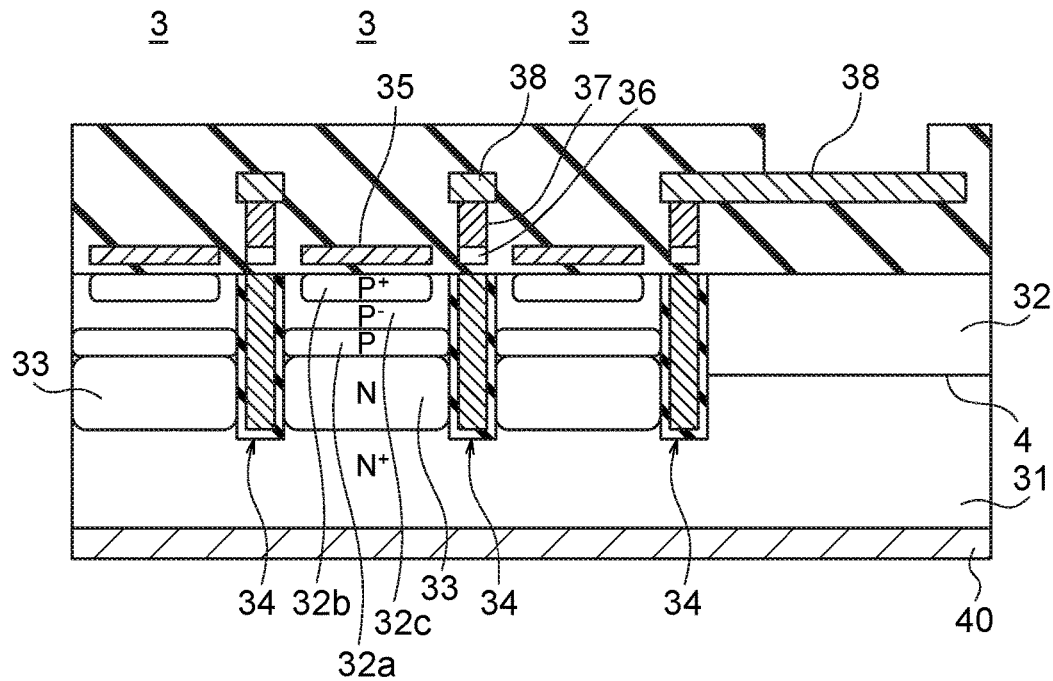

Lastly, the back-surface electrode 40 to function as the cathode electrode is formed on the bottom surface of the semiconductor substrate 31, so that a reverse bias voltage is applied (FIG. 11). Although the procedure of polishing the semiconductor substrate 31 or the like is also carried out to form the back-surface electrode 40, the procedure is not explained herein.

Figure 12:
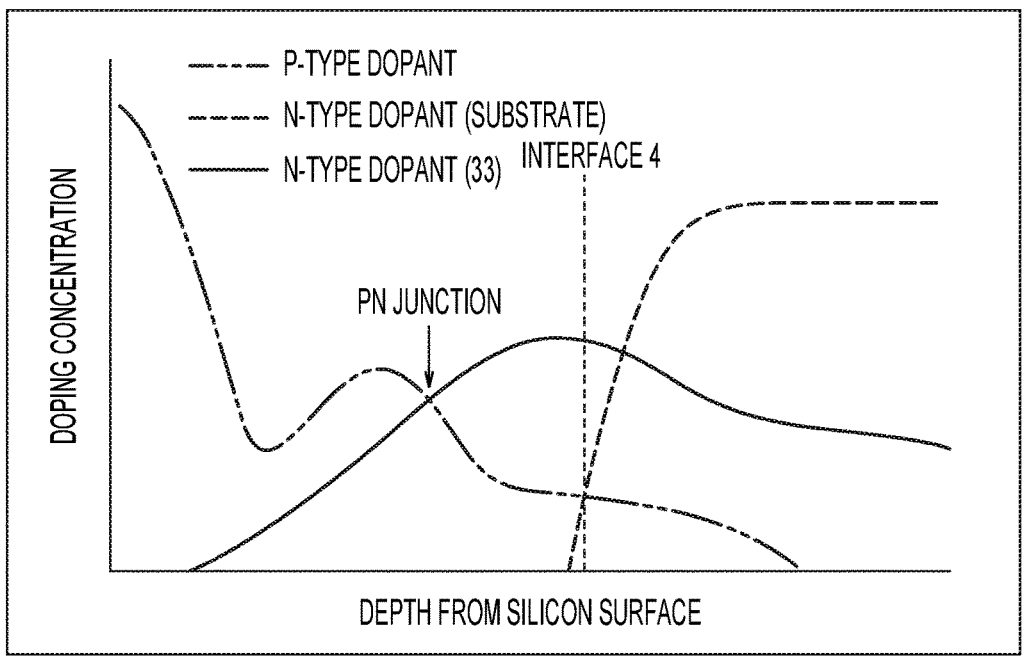
FIG. 12 is a graph showing the doping concentration distribution in the APD cells of a photodetection element manufactured by a manufacturing method according to the embodiment.

FIG. 12 shows the impurity concentration distribution in a direction perpendicular to the substrate in the APD cells 3 of the photodetection element 1 manufactured by the above manufacturing method. As can be seen from FIG. 12, the N-type semiconductor layer 33 is formed in a region including the interface 4 formed from the N$^+$-type semiconductor substrate 31 and the P$^−$-type epitaxial layer 32.

The structure of the photodetection element 1 described above in conjunction with the manufacturing method according to this embodiment is merely an example, and the trench isolation structure 34 may be formed after the formation of the signal readout lines 38, for example. Therefore, the trench isolation structure 34 may not be formed below the quench resistor 36 and the signal readout lines 38.

Alternatively, the trench isolation structure 34 may be formed on the bottom surface side of the semiconductor substrate 31.

(First Modification)

Figure 13:
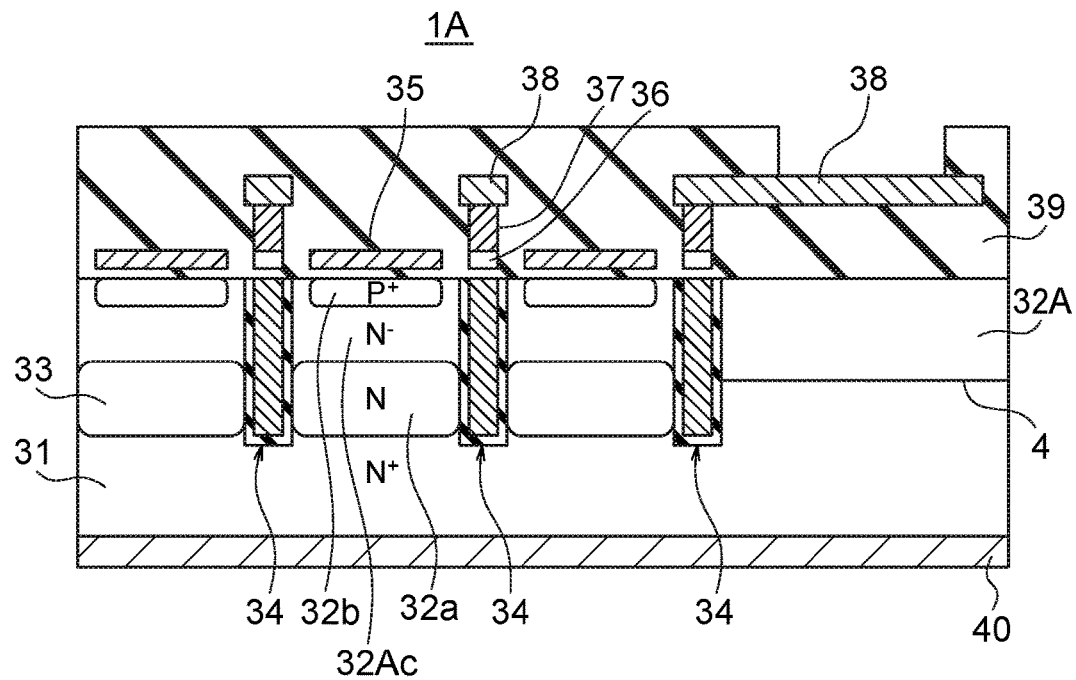
FIG. 13 is a cross-sectional view of a photodetection element according to a first modification.

FIG. 13 shows a cross-section of a photodetection element according to a first modification of this embodiment. The photodetection element 1A of the first modification has the same structure as the photodetection element 1 of the embodiment shown in FIG. 2, except that the P⁻-type epitaxial layer 32 is replaced with an N⁻-type epitaxial layer 32A, and the P-type semiconductor layer 32a is removed. The doping concentration in the epitaxial layer 32A is lower than the doping concentration in the semiconductor layer 33. In the first modification, the region of the epitaxial layer 32A located between the lower portion of the P⁺-type semiconductor layer 32b and the upper portion of the N-type semiconductor layer 33 serves as an avalanche layer 32Ac.

(Second Modification)

Figure 14:
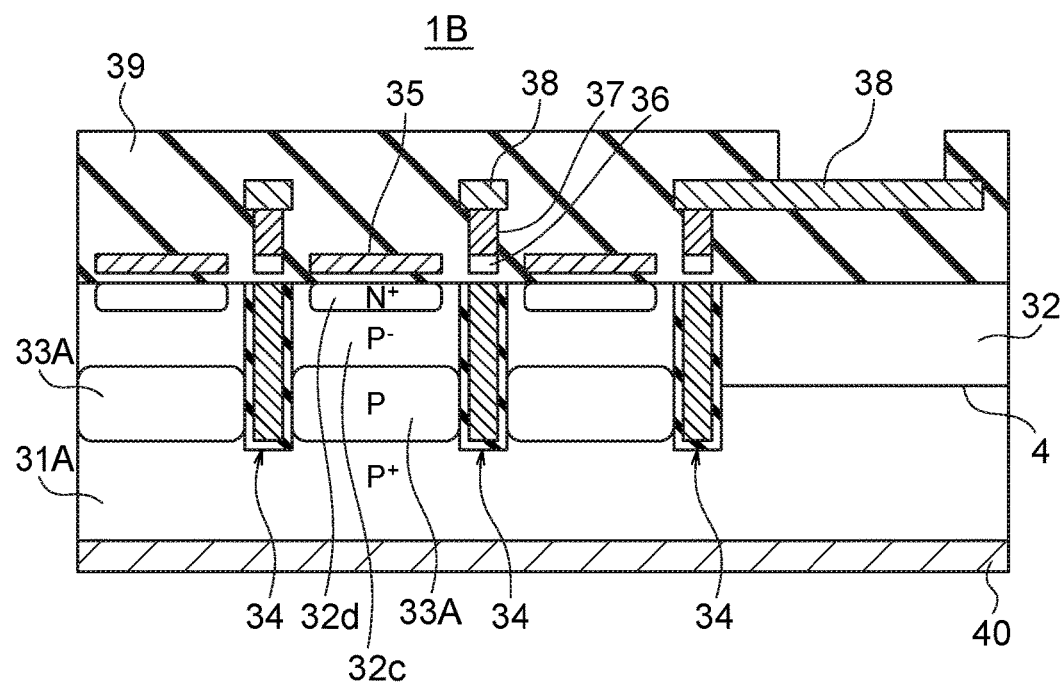
FIG. 14 is a cross-sectional view of a photodetection element according to a second modification.

FIG. 14 shows a cross-section of a photodetection element according to a second modification of this embodiment. The photodetection element 1B of the second modification has the same structure as the photodetection element 1 of the embodiment shown in FIG. 2, except that the N⁺-type semiconductor substrate 31 is replaced with a P⁺-type semiconductor substrate 31A, the N-type semiconductor layer 33 is replaced with a P-type semiconductor layer 33A, the P⁺-type semiconductor layer 32b is replaced with an N⁺-type semiconductor layer 32d, and the P-type semiconductor layer 32a is removed. The doping concentration in the semiconductor layer 33A is lower than the doping concentration in the semiconductor substrate 31A, and is higher than the doping concentration in the epitaxial layer 32. In the second modification, the region of the epitaxial layer 32 located between the lower portion of the N⁺-type semiconductor layer 32d and the upper portion of the P-type semiconductor layer 33A serves as an avalanche layer 32c.

(Third Modification)

Figure 15:
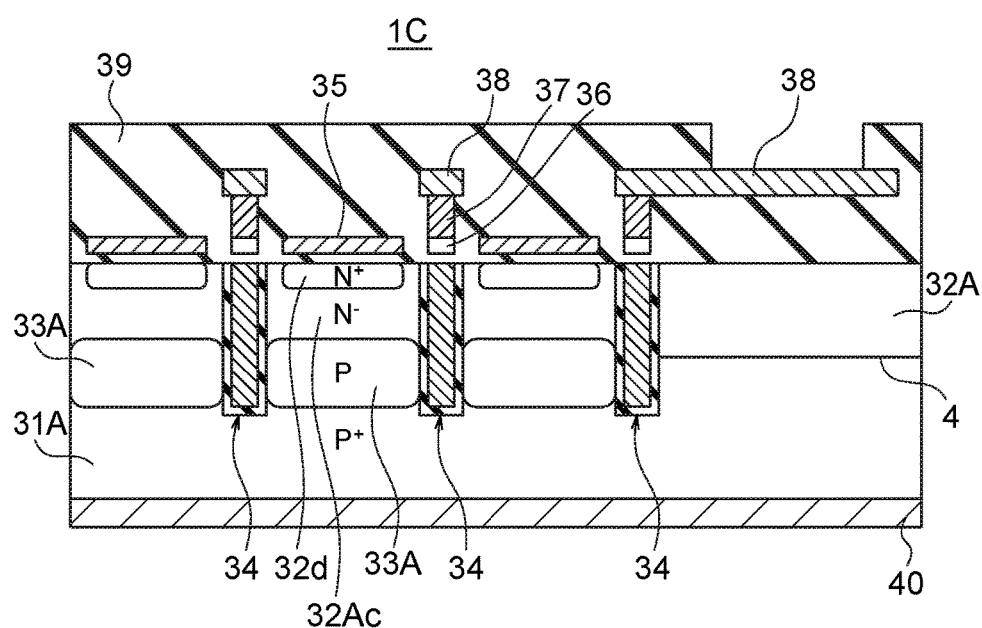
FIG. 15 is a cross-sectional view of a photodetection element according to a third modification.

FIG. 15 shows a cross-section of a photodetection element according to a third modification of this embodiment. The photodetection element 1C of the third modification has the same structure as the photodetection element 1 of the embodiment shown in FIG. 2, except that the N⁺-type semiconductor substrate 31 is replaced with a P⁺-type semiconductor substrate 31A, the P⁻-type epitaxial layer 32 is replaced with an N⁻-type epitaxial layer 32A, the N-type semiconductor layer 33 is replaced with a P-type semiconductor layer 33A, the P⁺-type semiconductor layer 32b is replaced with an N⁺-type semiconductor layer 32d, and the P-type semiconductor layer 32a is removed. The doping concentration in the semiconductor layer 33A is lower than the doping concentration in the semiconductor substrate 31A. The doping concentration in the semiconductor layer 32d is higher than the doping concentration in the epitaxial layer 32A. In the third modification, the region of the epitaxial layer 32A located between the lower portion of the N⁺-type semiconductor layer 32d and the upper portion of the P-type semiconductor layer 33A serves as an avalanche layer 32Ac.

Figure 16A:
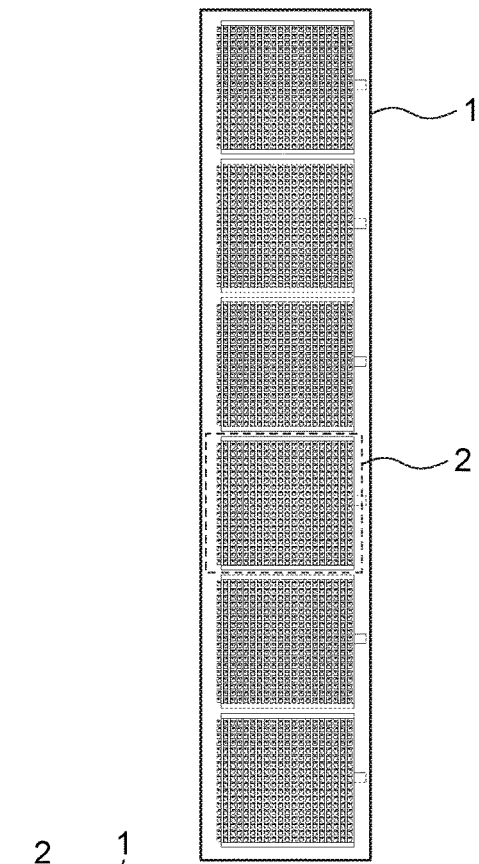
FIGS. 16A and 16B are plan views of photodetection elements according to other embodiments.
Figure 16B:
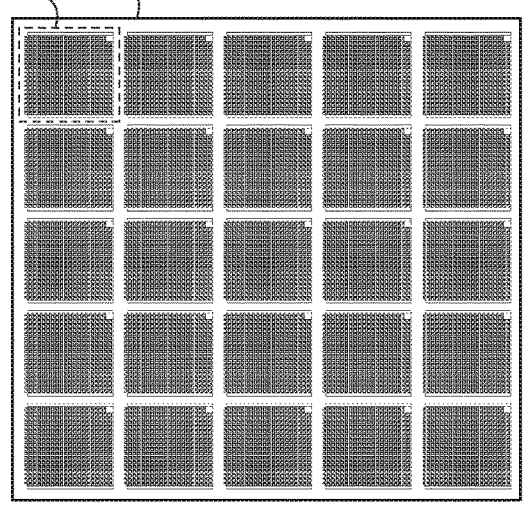

As shown in FIGS. 16A and 16B, SiPMs 2 may be arranged in a line or in a matrix, to form a photodetection element having more than one output system. In the above described manufacturing method, the connection to the readout circuit (not shown) is established by wire bonding via a pad. However, a through-silicon via (TSV) structure may be adopted, and the back surface side of the semiconductor substrate 31 may serve as the outputting side in this structure. In this case, a pad opening that reaches the signal readout lines 38 is formed on the back surface side of the semiconductor substrate 31, and an electrode is formed in the pad opening.

As described so far, with the photodetection elements of this embodiment and the modifications thereof, it is possible to obtain SiPMs in which variation in the breakdown voltage among the APD cells is reduced, which has been difficult to control in a conventional structure. Thus, a higher accuracy can be achieved in measuring photons with an SiPM serving as a detector. That is, it is possible to provide a photodetection element that can reduce or prevent decrease in photon measurement accuracy.

A secondary effect to reduce variation in breakdown voltage is also achieved. Thus, a larger area than a conventional SiPM can be achieved, and the dynamic range in which photon measurement can be conducted is greatly widened.

Further, in a detector in which SiPMs are arranged in a line or in a matrix form, manufacturing can be performed chip by chip, as opposed to conventional tiling mounting on a chip basis. Thus, a large decrease in cost can be achieved.

Furthermore, as the characteristics in the wafer plane become uniform, the yield of excellent chips becomes much higher, and the costs can be lowered accordingly. In a photodetection element of this embodiment, the impurity implantation process is added. However, the conventionally-needed sheet-type CMP procedure for equalizing the thicknesses of epitaxial layers becomes unnecessary. Thus, the number of procedures becomes substantially smaller, leading to lower costs and a shorter formation time.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A photodetection element comprising a photodiode cell, the photodiode cell including: a semiconductor substrate; a first semiconductor layer disposed on the semiconductor substrate; a second semiconductor layer disposed in a region including an interface between the semiconductor substrate and the first semiconductor layer, the second semiconductor layer being of the same conductivity type as the semiconductor substrate; a third semiconductor layer disposed in a surface region of the first semiconductor layer; and a fourth semiconductor layer disposed on the second semiconductor layer side of the first semiconductor layer, wherein the semiconductor substrate is an N-type semiconductor substrate, the first semiconductor layer is a P-type semiconductor layer, the second semiconductor layer is an N-type semiconductor layer having a lower doping concentration than the semiconductor substrate, the third semiconductor layer is a P-type semiconductor layer having a higher doping concentration than the first semiconductor layer, and the fourth semiconductor layer is a P-type semiconductor layer having a higher doping concentration than the first semiconductor layer and a lower doping concentration than the third semiconductor layer.

2. The photodetection element according to claim 1, wherein the photodiode cell includes a quench resistor, one terminal of the quench resistor being connected to the third semiconductor layer.

3. The photodetection element according to claim 1, wherein the photodiode cell includes an antireflection layer located above the third semiconductor layer.

4. A photodetection element comprising a plurality of photodiode cells that are connected in parallel, the photodiode cells are the photodiode cell according to claim 1 respectively.

5. The photodetection element according to claim 4, wherein the semiconductor substrate is an N-type semiconductor substrate, the first semiconductor layer is a P-type semiconductor layer, the second semiconductor layer is an N-type semiconductor layer having a lower doping concentration than the semiconductor substrate, and the third semiconductor layer is a P-type semiconductor layer having a higher doping concentration than the first semiconductor layer.

6. The photodetection element according to claim 5, further comprising
a fourth semiconductor layer disposed on the second semiconductor layer side of the first semiconductor layer, the fourth semiconductor layer being of P-type, the fourth semiconductor layer having a higher doping concentration than the first semiconductor layer and a lower doping concentration than the third semiconductor layer.

7. The photodetection element according to claim 4, wherein the photodiode cells include a quench resistor respectively, one terminal of the quench resistor being connected to the third semiconductor layer.

8. The photodetection element according to claim 4, wherein the photodiode cells include an antireflection layer located above the third semiconductor layer respectively.

9. A photodetection element comprising a photodiode cell,
the photodiode cell including: a semiconductor substrate; a first semiconductor layer disposed on the semiconductor substrate; a second semiconductor layer disposed in a region including an interface between the semiconductor substrate and the first semiconductor layer, the second semiconductor layer being of the same conductivity type as the semiconductor substrate; and a third semiconductor layer disposed in a surface region of the first semiconductor layer,
wherein the photodiode cell includes a quench resistor, one terminal of the quench resistor being connected to the third semiconductor layer.

* * * * *